United States Patent [19]

Nakasone et al.

[11] 4,152,608

[45] May 1, 1979

[54] MOMENTARY CONTACT LIGHT SWITCH

[76] Inventors: Henry H. Nakasone, 1672 Camrose Way, Anaheim, Calif. 92802; Bruce D. Jimerson, 6415 Corsini Pl., Rancho Palos Verdes, Calif. 90274

[21] Appl. No.: 768,544

[22] Filed: Feb. 14, 1977

[51] Int. Cl.$^2$ .............................................. H03K 17/00

[52] U.S. Cl. ................................ 307/252 N; 307/293; 315/194; 307/252 Q

[58] Field of Search ............... 307/252 N, 252 Q, 293, 307/114; 328/5; 315/194, 199; 323/19, 41; 200/51 R

[56] References Cited

U.S. PATENT DOCUMENTS

| | | | |
|---|---|---|---|
| 3,745,382 | 7/1973 | Hoge et al. | 307/252 N |
| 3,898,516 | 8/1975 | Nakasone | 315/194 |

*Primary Examiner*—Stanley D. Miller, Jr.
*Assistant Examiner*—B. P. Davis
*Attorney, Agent, or Firm*—Bruce D. Jimerson

[57] ABSTRACT

The specification discloses a circuit which responds to a momentary contact closure to effect a gradual change from the "off" state to the "on" state, or a delayed change from the "on" state to the "off" state. In one embodiment, two interactive circuits are utilized to effect the above results from either of two remote locations. Each interactive circuit responds to a momentary contact closure at either location.

4 Claims, 3 Drawing Figures

MOMENTARY CONTACT LIGHT SWITCH

BACKGROUND OF THE INVENTION

Cross Reference to Related Patents and Patent Applications

U.S. Pat. No. 3,898,516 entitled "Lighting Control System For Incandescent Lamps" filed May 29, 1973 by Henry N. Nakasone and Application Ser. No. 595,585 now Pat. No. 4,008,416 entitled "Circuit for Producing a Gradual Change in Conduction Angle" filed July 14, 1975 by Henry H. Nakasone. The contents of each are incorporated herein by reference for the purpose of providing additional background information.

Reference is also made to a Patent Application entitled, "Soft Switch with Rapid Recovery Circuit" by Henry H. Nakasone, Ser. No. 768,547 filed concurrently herewith.

Description of the Prior Art

The advantages of gradual "turn-on" and delayed "turn off" have been enumerated in the above referred Patents and Patent Applications. In all prior art arrangements, however, mechanical latching switches were required in order to change the state of the circuit to increase or decrease the power applied to the load. In some applications, however, it is desirable to utilize a momentary contact switch to effect a change in the state of the circuitry. Such an arrangement is commonly utilized in household applications, for example, to achieve rapid "turn-on" and "turn-off" of lights using a wall switch which requires a very light momentary contact. Such systems typically employ special low voltage wiring between the switch and a centralized relay station. What is actually desired is a momentary contact switching system which can be used to control household lights and outlets that does not require specialized wiring and auxilliary relays. In addition, it is desirable that the power to the outlets and lights be increased gradually (to protect the loads from high current surges) and finally extinguished only after a given time delay following an initial power reduction at the time the momentary contact switch is depressed.

Accordingly, a primary object of the present invention is to provide a momentary contact light switch which can be used to replace any conventional household light switch without changing the household wiring.

Another object of the present invention is to provide a momentary contact light switch which does not utilize relays or other mechanical devices to effect a change in the state of the system.

A further object of the invention is to provide a bistable switching circuit for an A-C source which can be triggered from the "off" state to the "on" state and vice versa by depressing a momentary contact switch.

Another object of the invention is to provide a gradual change in the amount of A-C power applied to load following a change in the state of bistable switching device.

Another object of the invention is to provide a gradual "turn-on" and "turn-off" of a lamp from either of two momentary contact switches which are interconnected only by the A-C power supplied to the stations where the momentary contact switches are located.

Other objects and advantages of the present invention will be obvious from the detailed description of a preferred embodiment given herein below.

SUMMARY OF THE INVENTION

The aforementioned objects are realized by the present invention which comprises a triac, the trigger voltage of which is delayed by a phase shifting network having a phase delay dependent upon the charge of a series connected accumulating capacitor. The charge on the accumulating capacitor is in turn controlled by a transistor, the base drive of which is changed by momentary depression of a switch which (1) either "cuts-off" the transistor by partially discharging a base holding capacitor through the accumulating capacitor or (2) causes the transistor to conduct by transferring a portion of the accumulating capacitor charge to the base holding capacitor where control from either of two remote locations is desired. The individual switch circuits are adopted to include a current sensing transistor. The actuation of a momentary contact switch at one station is sensed by the voltage developed across the base emitter junction of the current sensing transistor at the other station. As a consequence, both circuits are activated from the "off" state to the "on" state and vice versa by momentary closure of contacts at either location. The rate at which the "turn-on" or "turn-off" proceeds can be changed from instantaneous (not observable to human beings) to several seconds (depending upon the values of the components.

DETAILED DESCRIPTION OF A PREFERRED EMBODIMENT

Figure 1:
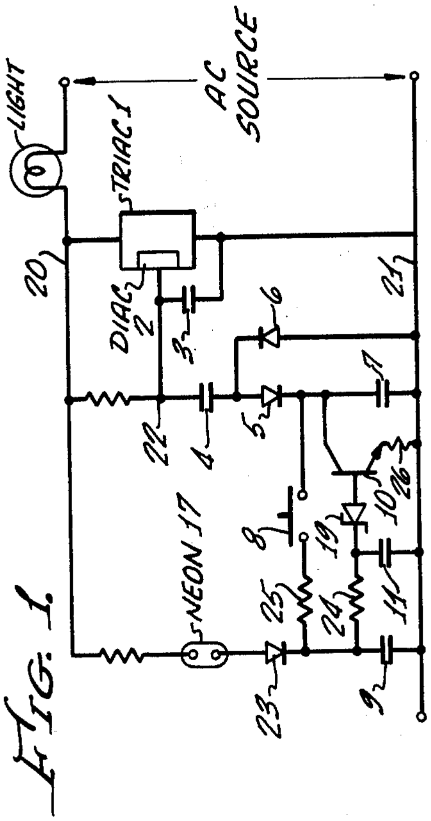
FIG. 1 shows a schematic diagram of a preferred embodiment of the invention for use at a single station.

Adverting to the drawings, and particularly FIG. 1, a preferred embodiment of the invention comprises a triac 1 having an integral diac 2, a firing capacitor 3, a phase shifting network comprising capacitor 4 and diodes 5 and 6, the delay of which is dependent upon the charge of an accumulating capacitor 7. Switch 8 is a momentary contact push button, which in most applications will be wall mounted in a manner similar to convention household light switches. The base holding capacitor 9 functions to store a positive charge for maintaining transistor 10 in the "on" (conducting state) so that triac 1 will remain off until switch 8 is depressed. Capacitor 11 functions to produce a slight (2 second) delay in turning transistor 10 "on" when switch 8 is depressed to turn the circuit "off." The operation of the circuit is described below.

As an initial condition, it will be assumed that Triac 1 is non-conducting so that the full A-C voltage appears across points 20 and 21. Capacitor 9 will thus be charged to a positive potential, and transistor 10 will be turned "on" by virtue of the base current flowing through zener diode 19. The current flowing in the collector of transistor 10 maintains capacitor 7 discharged so that (with the value of capacitor 4 and resistor 22 chosen sufficiently large) the voltage swing at junction 22 is insufficient to breakdown diac 2. In essence, the feedback through neon 17 diode 23, resistor 24, and zener 19 is positive, and the circuit remains in its quiescent "off" state until something changes.

When switch 8 is depressed, current flows through resistor 25 causing the charge on capacitor 9 to decrease and the charge on capacitor 7 to increase. As a consequence, transistor 10 stops conducting and triac 1 begins to conduct during the latter part of each A-C half cycle. Capacitor 7 continues to charge by virtue of the current flowing in resistor 22, phase shifting capacitor 4 and diode 15 so that triac 1 fires progressively earlier each half cycle. When the conduction angle increases to a degree such that the voltage across points 20 and 21 is less than that required to breakdown neon 17, recharge of capacitor 9 is precluded (it will be understood that the component values are chosen so that this occurs prior to the time that capacitor 9 is recharged to a voltage equal to that of zener 19). The circuit thus continues with the gradual turn "on" process until the quiescent "on" state is achieved (i.e., capacitor 7 fully charged to a value equal to twice that of the breakdown voltage of diac 2 and triac 1 conducting for approximately 90% of the input cycle).

After the "on" state is reached, switch 8 can be momentarily depressed to initiate the delayed "turn-off" process. When this occurs, a portion of the charge on capacitor 7 is transferred to capacitor 9 through resistor 25, so that both capacitors assume the same voltage. (The values of the components are chosen such that this voltage will be in excess of the breakover voltage of Zener 19). Transistor 10 thus begins to conduct and the decreased potential on capacitor 7 reduces the conduction angle to a point such that neon 17 fires to maintain the charge on capacitor 9. The circuit thus proceeds to "turn-off" within a time span which is determined by the values of the components 24, 26 and 7.

In summary, the circuit has two stable states (quiscent "off" and quiscent "on" and two unstable states (gradual "turn-on" and gradual "turn-off"). The duration of the latter can be long (3 to 8 seconds) or imperceptably short (0.1 to 0.5 seconds) to the observer, depending upon the desired effect.

Figure 2:
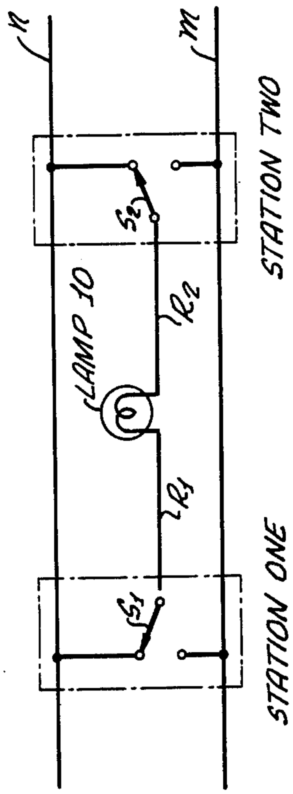
FIG. 2. (PRIOR ART)
FIG. 2 shows a convention three-way wiring arrangement in the "off" state.

While the circuit of FIG. 1 is totally satisfactory for controlling a light or other apparatus from a single location, it cannot be used in a standard three-way configuration like that shown in FIG. 2 unless additional wires are added. What is desired, therefore, is a momentary contact switching arrangement for achieving gradual "turn-on" and delayed "turn-off" from either of two remote locations utilizing the existing A-C house wiring N, M, $R_1$ and $R_2$. This objective is realized by the circuit shown in FIG. 3.

Figure 3:
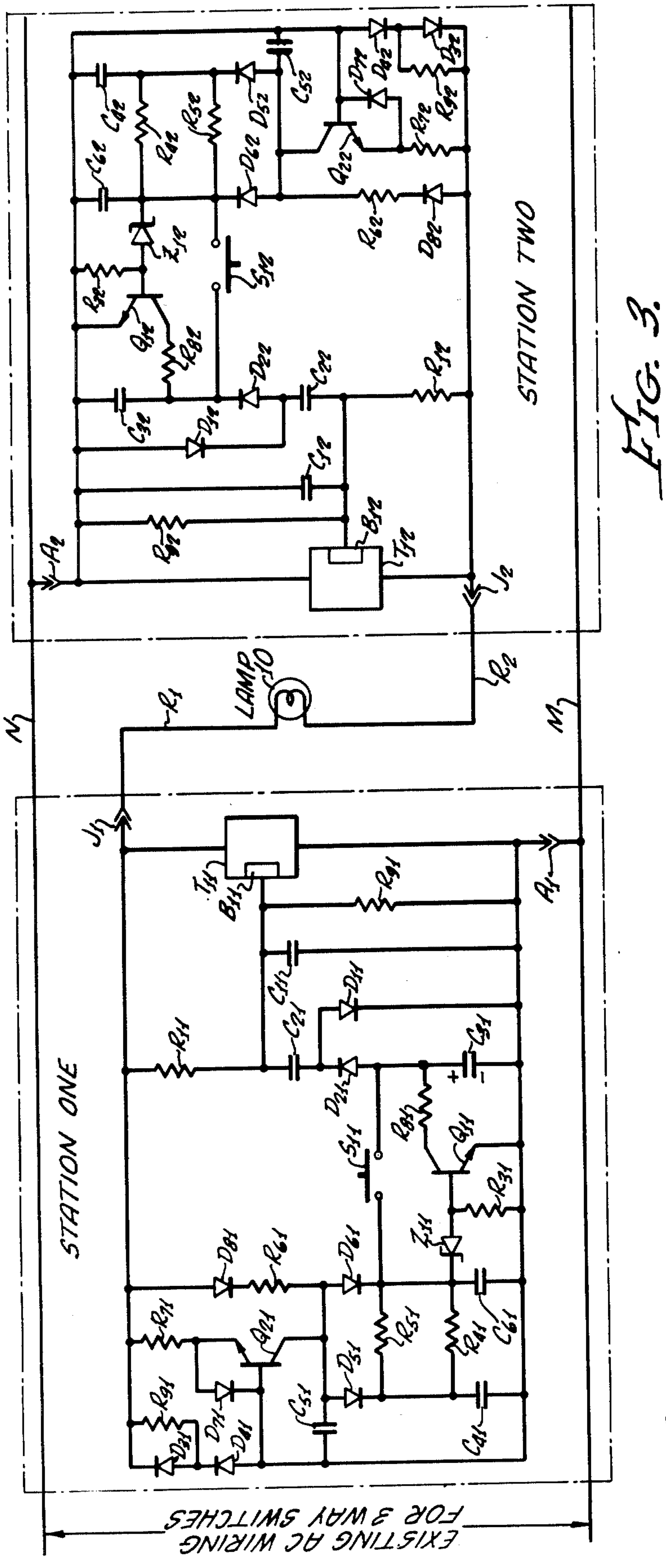
FIG. 3 shows a schematic diagram of a preferred 3-way switch embodiment for use in an existing household wiring arrangement.

In FIG. 3 an operator can effect gradual "turn-on" or delayed "turn-off" from either of two locations. The circuits at station one and two of FIG. 3 are identical, the components such as SCR $T_{11}$ at station one corresponding to an identical counterpart $T_{12}$ at station two, capacitor $C_{11}$ at station one corresponding to $C_{12}$ at station two, and so forth. The circuit at station one is connected to one side of the A-C line M at $A_1$ and to one side of the lamp 10 wire $R_1$ at $J_1$. The circuit at station two is connected to the other side of the A-C line N at $A_2$ and to the opposite side of the lamp 10 wire $R_2$ at $J_2$. An explanation of the interactive operation of the two circuits will be described in terms of the following sequence of events:

1. Off State

As an initial condition, it will be assumed that the voltage on accumulating capacitors $C_{31}$ and $C_{32}$ is zero so that neither SCR $T_{11}$ or $T_{12}$ will conduct during any part of the cycle. It will also be assumed that $Q_{21}$ is "Off" so that $Q_{11}$ is biased "On" by virtue of the current flowing through $D_{42}$, $R_{92}$, $D_{81}$, $R_{61}$, $D_{61}$ and Zener diode $Z_{11}$ whenever the "N" side of A-C source is positive with respect to the "M" side. Similarly, it will be assumed that $Q_{22}$ is "Off" so that $Q_{12}$ is biased "On" by virtue of the current flowing through $D_{41}$, $R_{91}$ $D_{82}$, $R_{62}$, $D_{62}$ and Zener diode $Z_{12}$ whenever the "M" side of the A-C source is positive with respect to the "N" side.

In addition to these currents (which are limited to a small fraction of a milliamp by the value of resistors $R_{61}$ and $R_{62}$) small additional currents flow through $R_{11}$ and $R_{10}$ which would charge capacitors $C_{31}$ and $C_{32}$ were it not for the current flowing in the collectors of $Q_{11}$ and $Q_{12}$ respectively. It will be noted also that during the "Off" state capacitors $C_{51}$ and $C_{41}$ charge to a voltage which is approximately equal to the breakdown voltage of $Z_{11}$ (typically 25 volts) whereas $C_{42}$ and $C_{52}$ charge to voltage equal to the breakdown voltage of $Z_{12}$ (also typically 25 volts).

2. Gradual "Turn-on"

"Turn On" is effected by depressing either of the momentary contact switches $S_{11}$ (at station one) or $S_{12}$ (at station two). Since the circuits are identical, the interactive relationship will be described by assuming that switch $S_{11}$ is depressed. When this occurs the capacitors $C_{51}$ and $C_{41}$ (which have been charged to the breakdown voltage of $Z_{11}$ during the quiescent "Off" state) discharge through $R_{51}$ and $R_{81}$ to raise the voltage of $C_{31}$ to effect a decrease in the phase delay of capacitor $C_{21}$. As a consequence, SCR $T_{11}$ begins to conduct near the end of the next positive half cycle (i.e., line N positive with respect to line M). The discharge of capacitors $C_{51}$ and $C_{41}$ cuts off base current to $Q_{11}$ enabling the charge on $C_{31}$ to increase during each positive half cycle—thus progressively increasing the conduction angle of $T_{11}$. The conduction of SCR $T_{11}$ also causes $Q_{22}$ at station two to turn "On" as a consequence of the voltage developed across $D_{42}$ and $R_{92}$ (the latter having a low ohmic value (e.g., 100Ω) to prevent turn "On" of $Q_{22}$ (as a consequence of the minute currents drawn by $R_{61}$ and $R_{11}$ in the "Off" state (prior to the time $T_{11}$ conducts). When $Q_{22}$ conducts, $C_{52}$ is discharged, thus cutting off drive current to the base of $Q_{12}$ allowing $C_{32}$ to charge during each negative half cycle (line "M" positive with respect to line "N"). As the voltage of $C_{32}$ increases, a point is reached where SCR $T_{12}$ begins to conduct. Thereafter the charge on $C_{32}$ increases with each positive half cycle ("M" positive with respect to "N") with a resultant increase in conduction angle.

Were it not for the conduction of $T_{12}$, the capacitor $C_{41}$ would be recharged through $D_{51}$, thus causing $Q_{11}$ to conduct to return the system to the "Off" state. It will be noted, however, that the conduction of SCR $T_{12}$ at station two causes $Q_{21}$ to conduct in exactly the same manner that the conduction of SCR $T_{11}$ caused $Q_{22}$ to conduct. Hence, $C_{51}$ will be discharged during each half cycle in which $T_{12}$ conducts causing $Q_{11}$ to remain "Off."

In summary, depression of either $S_{11}$ or $S_{12}$ will cause the associated SCR ($T_{11}$ or $T_{12}$) to commence conducting. The conduction angle increases in accordance with the rate at which the associated accumulating capacitor ($C_{31}$ or $C_{32}$) charges. Conduction of an SCR at one station also causes the current sensing transistor (either $Q_{22}$ or $Q_{21}$) at the opposite station to conduct so as to cut off the associated accumulating capacitor discharge transistor (either $Q_{12}$ or $Q_{11}$) allowing the SCR at the opposite station to commence conducting. The gradual turn "On" process continues with both SCRs conducting for progressively greater durations until the quiescent "On" state is reached.

3. Delayed Turn Off

After the quiescent "On" state is reached, capacitors $C_{31}$ and $C_{32}$ will be charged to a voltage which is approximately twice that of the breakdown voltage of the associated diac (either $B_{11}$ or $B_{12}$). Typically, this will be in the range of 50 volts. Depression of either $S_{11}$ or $S_{12}$ will cause the charge so stored to be abruptly transferred to the base holding capacitor (either $C_{41}$ or $C_{42}$) which immediately causes the associated accumulating capacitor discharge transistor (either $Q_{11}$ or $Q_{12}$) to conduct. Thus if $C_{31}$ is chosen as 10 $\mu f$ and is charged to 50 volts and $C_{41}$ is .5 $\mu f$, closure of $S_{11}$ will discharge $C_{31}$ through $R_{51}$ until the voltage on $C_{41}$ and $C_{31}$ are equal. If $C_{41}$ maintains a charge of 20 volts during the off state (by virtue of the charge and discharge of $C_{51}$ through $R_{61}$ and $Q_{21}$) then the voltage on $C_{41}$ will rise to approximately 40 volts upon closure of $S_{11}$ causing $Q_{11}$ to rapidly discharge $C_{31}$, completely cutting off conduction of SCR $T_{11}$ until the voltage of $C_{41}$ has dropped to a point such that the $Q_{11}$ collector current is insufficient to maintain $C_{31}$ discharged. If $R_{41}$ is chosen as 1.5 megohms, this duration is approximately 5 seconds—it is thus necessary to cut off $Q_{21}$ to recharge $C_{41}$ within this time period.

It will be noted that $Q_{22}$ ceases to conduct when $T_{11}$ is cut off. As a consequence, $C_{42}$ begins to charge through $D_{82}$, $R_{62}$, and $D_{52}$. If $R_{61}$ is chosen so that the time required to activate $Q_{12}$ is less than 5 seconds, then $C_{32}$ will be discharged so as to cut off $T_{12}$ (and consequently $Q_{21}$) within the critical 5 second period to prevent a spurious reactivation of the system to the "On" state.

In summary, momentary depression of $S_{11}$ discharges the associated accumulating capacitor $C_{31}$ and charges the associated base holding capacitor $C_{41}$ which supplies base current to the associated accumulating capacitor discharge transistor $Q_{11}$. The latter functions to complete and maintain $C_{31}$ discharged, thus cutting off $T_{11}$ and $Q_{22}$ for a time greater than that necessary to cut off $T_{12}$ by charging $C_{42}$ through $R_{62}$. Since both circuits are identical, the same result is achieved (in reverse order) by momentarily depressing $S_{12}$ instead of $S_{11}$—either switch functioning to abruptly decrease the light intensity by ½ for several seconds followed by complete extinguishment.

Values of Components:

Resistors $R_{11}$ and $R_{12}$ should be chosen in conjunction with capacitors $C_{21}$ and $C_{22}$ respectively so as to assure that the potential applied to diacs $B_{11}$ and $B_{12}$ does not exceed their breakdown voltage when capacitors $C_{31}$ and $C_{32}$ are fully discharged. Capacitors $C_{11}$ and $C_{12}$ should be chosen as small as possible—consistant with reliable triggering of the SCR's $T_{11}$ and $T_{12}$. Resistors $R_{91}$ and $R_{92}$ should be chosen to adequately discharge $C_{11}+C_{21}$ and $C_{21}+C_{22}$ during the "Off" state to prevent a spurious firing of the SCR's due to a charge "build-up" across the diacs $B_{11}$ and $B_{12}$. Capacitors $C_{31}$ and $C_{32}$ should be approximately twice the value of $C_{41}$ and $C_{42}$, the actual value being dependent upon the desired "turn-on" time and "turn-off" delay. Zeners $Z_{11}$ and $Z_{12}$ should be about 20–25 volts. Capacitors $C_{61}$ and $C_{62}$ should be chosen in conjunction with resistor $R_{41}$ and $R_{42}$ to provide a slight delay (0.5 to 1 seconds). This prevents discharge of $C_{41}$ or $C_{42}$ by delaying "turn-on" of $Q_{11}$ or $Q_{12}$ if $S_{11}$ or $S_{12}$ is not released immediately when initiating the delayed "turn-off" process. Resistors $R_{51}$ and $R_{52}$ should provide a time delay of approximately 0.1 seconds in equalizing the voltage between capacitors $C_{41}$–$C_{31}$ and $C_{42}$–$C_{32}$. Resistors $R_{61}$ and $R_{62}$ should be chosen in conjunction with capacitors $C_{51}$ and $C_{52}$ so that the latter will charge to approximately 20 volts during ½ cycle of the A-C. Resistors $R_{91}$ and $R_{92}$ should be chosen to prevent "turn-on" of their respective transistors ($Q_{21}$ and $Q_{22}$) due to the minor currents flowing when the system is in the quiscent off state. Resistors $R_{71}$ and $R_{72}$ should be small enough to adequately discharge $C_{51}$ during ½ cycle of the A-C input.

The present invention accomplishes results not possible with any prior art switching arrangements. Although the teachings have been described in conjunction with particular circuits, it will be understood that the basic concepts of the invention are not limited thereto, and that numerous changes, modifications and substitutions may be made without departing from the spirit of the invention.

We claim:

1. A switching system for an A-C operated device comprising:

a solid state switching device having anode and cathode main terminals and a gate terminal means for altering the impedance between said main terminals from a high impedance state to a low impedance state;

means for connecting the main terminals of said solid state switching device in series with a load and an A-C power source;

momentary contact switching means operatively connected to the A-C power source for initiating a "Turn-on" or "Turn-off" process from a quiscent "Off" and "On" state, respectively;

an accumulating capacitor operatively connected to said momentary contact switching means;

rectifying means operatively connecting said accumulating capacitor with the A-C power source for progressively increasing the charge on said accumulating capacitor following an actuation of said momentary contact switching means at a time when the system resides on an "Off" state;

discharge means connected in parallel with said accumulating capacitor for decreasing the charge on said accumulating capacitor following an actuation of said momentary contact switching means at a time when said system resides in a quiscent "On" state;

phase shifting means connecting said accumulating capacitor to said gate terminal of said solid state switching device for varying the phase time at which the magnitude of the voltage applied to said gate terminal is sufficient to cause the impedance between said main terminals of said solid state switching device to change from a high value to a low value as an inverse function of the charge stored by said accumulating capacitor.

2. The apparatus recited in claim 1 wherein said momentary contact switching means is operatively connected to said accumulating capacitor and said discharge means by means causing the charge on said accumulating capacitor to be applied to actuate said discharge means when said momentary contact switching means is actuated at a time when the system resides in the quiscent "On" state.

3. A three-way switching system for controlling an A-C powered device from a first and second station comprising:

a first control element means at a said first station for controlling the conduction angle during a first polarity of the A-C source;

a first rectifier means at said first station for supplying half wave power to said second station during a second polarity of the A-C source;

a second control element means at said second station for controlling the conduction angle during the second polarity of the A-C source;

a second rectifier means at said second station for supplying half wave power to said first station during a first polarity of the A-C source;

circuit means at said first station for causing said first control element to change its conduction duration in response to a momentary contact closure at either of said stations and;

circuit means at said second station for causing said second control element to change its conduction duration in response to a momentary contact closure at either of said stations;.

4. The apparatus recited in claim 3 wherein said circuit means at said first station is connected to one side of the A-C power source and to one terminal of the device being controlled and comprises:

first means for detecting when the control element means at said second station is conducting and;

wherein said circuit means at said second station is connected to the other side of the A-C power source and to a second terminal of the device being controlled and comprises:

second means for detecting when the control element means at said first station is conducting.

* * * * *